United States Patent [19]
Conger

[11] 4,401,905
[45] Aug. 30, 1983

[54] ARRANGEMENT FOR TEMPERATURE STABILIZATION OF A LIMITER

[75] Inventor: Ronald R. Conger, Elsie, Mich.

[73] Assignee: General Electric Company, Lynchburg, Va.

[21] Appl. No.: 240,167

[22] Filed: Mar. 3, 1981

[51] Int. Cl.³ .............................................. H03K 5/08
[52] U.S. Cl. .................................. 307/546; 307/310; 307/565; 307/491; 328/171
[58] Field of Search ............... 307/540, 546, 551, 553, 307/561, 562, 491, 494, 503, 310; 328/169, 171, 172, 173, 175; 330/256, 289

[56] References Cited

U.S. PATENT DOCUMENTS

| | | |
|---|---|---|
| 2,927,223 | 3/1960 | Meirowitz . |
| 3,112,449 | 11/1963 | Miller .................................. 307/562 |
| 3,448,289 | 6/1969 | Harris .................................. 307/491 |
| 3,666,970 | 5/1972 | Abbott et al. . |
| 3,947,706 | 3/1976 | Holmes . |
| 3,992,622 | 11/1976 | Numata et al. ..................... 307/491 |
| 4,008,440 | 2/1977 | Mizukoshi ......................... 307/553 |
| 4,015,149 | 3/1977 | Tsunekawa et al. . |
| 4,096,382 | 6/1978 | Numata et al. . |
| 4,195,274 | 3/1980 | Suganuma . |

Primary Examiner—John Zazworsky
Attorney, Agent, or Firm—Cushman, Darby & Cushman

[57] ABSTRACT

An arrangement for temperature compensating an operational amplifier limiting circuit using diode feedback to perform the limiting function. The feedback diodes of the limiter are biased by a biasing arrangement including diodes having temperature characteristics corresponding to those of the feedback diode. The biasing arrangement is powered from the same voltage supply that powers the operational amplifier limiter.

10 Claims, 1 Drawing Figure

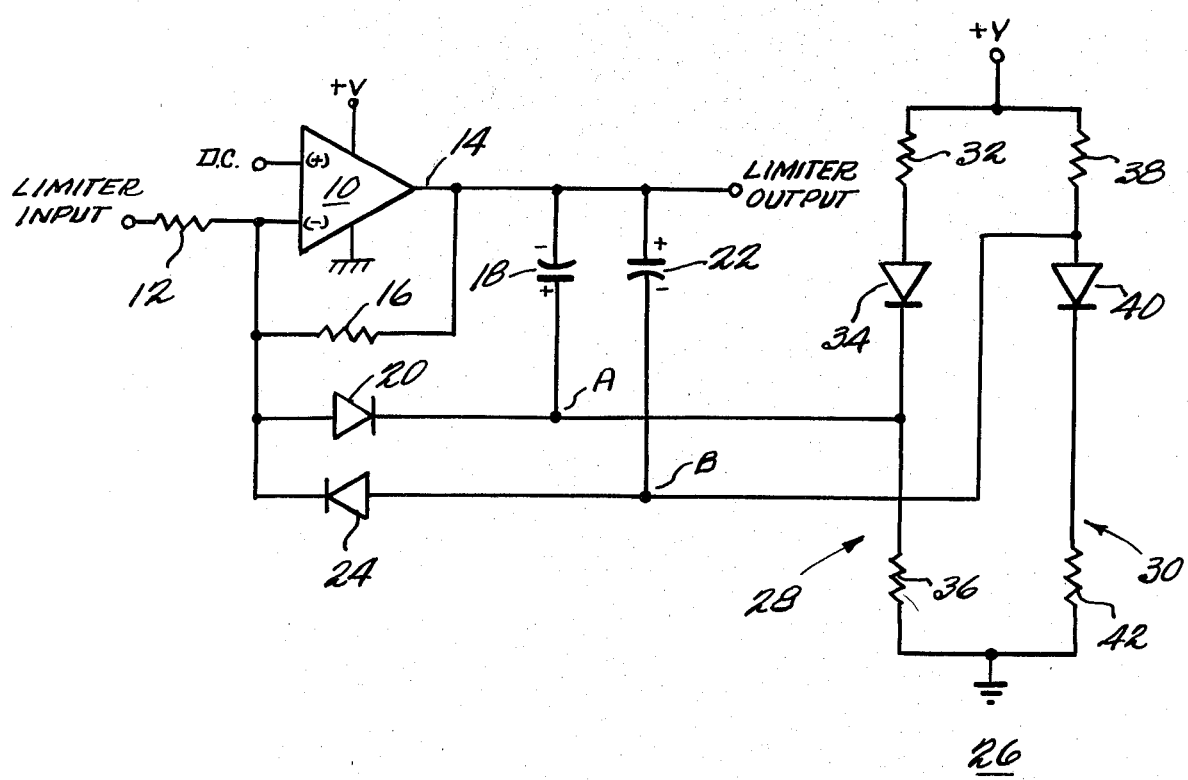

ARRANGEMENT FOR TEMPERATURE STABILIZATION OF A LIMITER

BACKGROUND OF THE INVENTION

This invention relates generally to limiter circuits and in particular to limiter circuit configurations utilizing an operational amplifier with feedback diodes performing the limiting function. Specifically, the present invention provides an arrangement for compensating the temperature characteristics of the feedback diodes.

Limiter circuits provide, in response to a variable amplitude input signal, an amplitude limited output signal, the amplitude being limited in accordance with some predetermined threshold level. In other words, they provide a constant amplitude output signal as long as an input signal thereto is a predetermined input range. A typical application of a limiter circuit would be to the processing of signals emerging from an IF amplifier or an FM receiver. The limiter circuit removes all amplitude variations from the frequency modulated signal so that a frequency discriminator can operate on a constant amplitude, frequency shifting signal.

Ideally, a limiter should provide its constant output amplitude over a wide temperature range for any input within its design range. A problem associated with the operation of limiters using operational amplifiers with feedback diodes is that the output level, if in limiting, varies with temperature according to the change in the forward voltage drop across the feedback diodes. This output voltage change can be significant over a temperature range of ±65° C. Typically, diodes change their forward voltage drop approximately −2.1 mV/°C. When a typical output voltage level is set to about 0.9 volts RMS or approximately 2.5 volts peak-to-peak, the 273 mV change in the diode's forward voltage drop is a significant factor over the wide temperature range.

In order to minimize the change in forward voltage drop with temperature, a known compensating arrangement utilizes a resistive voltage divider to provide a predetermined level of back bias on the feedback diodes around the operational amplifier. This resistive voltage divider includes only very close tolerance resistors. The back bias is quite stable over temperature and the diode forward bias potential change is not compensated for in the network. The problem with such an arrangement is that the AC signal from the limiter clips and limits at different levels as the temperature changes.

Another approach to temperature compensating limiter circuits is shown in U.S. Pat. No. 2,927,223—Meirowitz (issued Mar. 1, 1960). This patent is specifically incorporated herein by reference thereto.

Referring to FIG. 2 of the Meirowitz patent, there is shown diodes 18 and 19 intended to provide temperature compensation to the limiting diodes 11 and 12. This circuit, however, is not very practical for many applications because it requires two separate and distinct power supplies, namely source $V_b$ and voltage source 20. In addition, it provides no amplification of lower level signals. Furthermore, the Meirowitz arrangement requires that all used diodes have substantially similar conduction (current) characteristics over the temperature range. Also, it is necessary to select resistor 21 in order to set the current level through compensating diodes 18 and 19, which in turn sets the forward voltage drop across them.

SUMMARY OF THE INVENTION

To overcome the various disadvantages of known feedback diode limiter arrangements, there is provided a novel temperature compensating arrangement for an operational amplifier feedback diode limiter.

Essentially, instead of using only close tolerance resistors to bias the feedback diodes as is done in the resistive divider temperature compensator, previously discussed, the resistance of the bias network is split up and a diode added in series therewith on the appropriate side of the bias point. Using this arrangement, the bias level changes in accordance with the change in forward voltage needed to turn on the biasing diode. The voltage temperature characteristic of the biasing diode corresponding to each feedback diode of the limiter is selected to provide compensation for the temperature characteristic of its associated feedback diode. Using the diodes in the bias network causes substantially lower deviation of output level with a given temperature change. Compensation can be optimized depending upon the limiting level chosen. Deviation from ideal compensation results from the fact that a ratio is set by the bias resistors which does not allow all of the change of the diode potential to be transferred to the bias potential point of the feedback diodes. However, this slight deviation from ideal can be very small with the appropriate back bias level.

BRIEF DESCRIPTION OF THE DRAWINGS

The invention will be better understood by reference to the following detailed description and appended claims when read in conjunction with the sole FIGURE wherein:

The FIGURE is a detailed schematic diagram of the temperature compensated limiter circuit according to the present invention.

DETAILED DESCRIPTION OF THE PREFERRED EMBODIMENT

Referring now to the sole FIGURE there is shown a detailed schematic diagram of the temperature compensated limiter circuit according to the present invention. The heart of the limiter circuit is an operational amplifier 10 operating between a positive potential +V and ground. Operational amplifier 10 includes a non-inverting input for coupling to a DC potential and an inverting input for coupling to an input signal to be limited. The limiter input signal is coupled to the inverting input via an input resistor 12. An output 14 of operational amplifier 10 provides the output signal of the limiter. A feedback resistor 16 couples output 14 to the inverting input. A first feedback circuit from output 14 to the inverting input includes a first capacitor 18 and a first feedback diode 20. Capacitor 18 is polarized, the negative terminal thereof being coupled to output 14 and the positive terminal thereof being coupled to the cathode of diode 20. The anode of diode 20 is coupled to the inverting input of operational amplifier 20. A second feedback circuit includes a second capacitor 22 and a second feedback diode 24 coupling output 14 to the inverting input of amplifier 10. Capacitor 22 is also polarized, the positive terminal being coupled to output 14 and the negative terminal thereof being coupled to the anode of diode 24. The cathode of diode 24 is coupled to the inverting input of operational amplifier 10.

Biasing of feedback diodes 20 and 24 is obtained from a temperature compensating biasing circuit 26, powered from the same power supply that powers operational amplifier 10. Temperature compensating biasing circuit 26 includes two series dividers 28 and 30, each including two resistors and a diode. Series divider 28 includes a resistor 32, a diode 34 and a resistor 36, the junction between diode 34 and resistor 36 being coupled to the junction of capacitor 18 and diode 20. Series divider 30 includes a resistor 38, a diode 40 and a resistor 42, the junction between resistor 38 and diode 40 being coupled to the junction of capacitor 22 and diode 24. Temperature compensating biasing circuit 26 operates between +V and ground, as does operational amplifier 10, to provide a temperature compensated bias to diodes 20 and 24. Specifically, diode 34 provides a temperature compensated bias to diode 20 and diode 40 provides a temperature compensated bias for diode 24.

In essence, the resistive bias network, used in conventional biasing arrangements for a limiter feedback diodes are split up and a diode added in series therewith on the appropriate side of the bias point. The bias level then changes in accordance with the change in forward voltage needed to turn on the diode. The amount of stabilization provided by the temperature compensating biasing circuit 26 is limited only by the ratio of the bias resistors referencing the back biased diodes. Specifically, as the temperature changes, the voltage drop across diode 20 changes in accordance with its temperature characteristic. However, the same temperature change causes the voltage drop across diode 34 to change the voltage at junction A in the reverse direction so that limiting will occur as if a temperature change had not taken place. It is in the reverse direction because the cathode is connected to the biasing point A. Similarly, a temperature induced voltage change across diode 24 is compensated by a similar temperature induced voltage change across diode 40, which changes the back bias level in the same direction as the forward bias change because the anode is connected to the biasing point B. This indicates that as the diode forward voltage drop goes up with lower temperature, the back bias potential must decrease at point A to stabilize the negative peak limiting, and increase at point B to stabilize the positive peak limiting. Similarly, the opposite bias changes are required for the opposite temperature change.

Therefore, there has been provided a temperature compensating arrangement for operational amplifier feedback diode limiter. Obviously, other alternate embodiments will occur to those of ordinary skill in the art having the benefit of the teaching presented herein. Therefore, such alternate embodiments are intended to be included within the scope of the appended claims.

I claim:

1. A limiter circuit, comprising:
   an operational amplifier;
   a diode feedback circuit for said operational amplifier providing a limiting function, said diode feedback circuit comprising two feedback diodes having voltage-temperature characteristics different from one another; and
   a bias network for temperature compensating the diode feedback circuit, said bias network comprising two temperature compensating bias diodes, associated one each with each of said feedback diodes, for compensating said feedback diodes.

2. A limiter according to claim 1 wherein each voltage-compensating bias diode has the same temperature characteristic as its corresponding feedback diode.

3. A limiter according to claim 1 further comprising means for powering the operational amplifier and biasing network with the same voltage.

4. A limiter circuit according to claim 1, 2 or 3 wherein said diode feedback circuit comprises two capacitors, one capacitor being in series with each of said feedback diodes.

5. A limiter circuit comprising:
   an operational amplifier including a power input terminal for connection to a power supply, a non-inverting input for coupling to a DC signal, an inverting input for receiving an input signal to the limiter and an output terminal providing an output of the limiter;
   a feedback resistor coupling the output terminal with the inverting input terminal;
   a first series circuit including a first feedback diode and first feedback capacitor coupling the output terminal to the inverting input terminal, the first diode having a first voltage-temperature characteristic;
   a second series circuit including a second feedback diode and second feedback capacitor coupling the output terminal to the inverting input terminal, the second diode having a second voltage-temperature characteristic;
   a temperature compensating circuit powered from the same power supply powering said first and second series circuits for compensating the first and second temperature characteristics.

6. A limiter circuit according to claim 5 wherein the temperature compensating circuit comprises:
   a third series circuit including a third resistor and a third (temperature compensating) diode, the junction therebetween being coupled to the junction between the first capacitor and first diode;
   a fourth series circuit including a fourth resistor and fourth (temperature compensating) diode coupled to the junction between the second capacitor and second diode.

7. A limiter circuit comprising:
   an operational amplifier including a power input terminal for connection to a power supply, a non-inverting input for coupling to a D.C. signal, an inverting input for receiving an input signal to the limiter and an output terminal providing an output of the limiter;
   a first feedback circuit including a first diode and first capacitor, the first diode having a first voltage-temperature characteristic;
   a second feedback circuit including a second diode and a second capacitor, the second diode having a second voltage-temperature characteristic;
   first means for biasing the first diode including a third diode having a third voltage-temperature characteristic compensating the first voltage-temperature characteristic;
   second means for biasing the second diode including a fourth diode having a fourth voltage-temperature characteristic for compensating the second voltage-temperature characteristic;
   a power supply and means for applying the same voltage from said power supply to said first and second biasing means and said power input terminal of said operational amplifier.

8. A limiter circuit according to claim 7 wherein said first biasing means comprises a first resistor coupled to said power supply;

the third diode coupled to the first resistor;

and a second resistor coupling the third diode to ground, the junction between the third diode and second resistor being coupled to the junction of the first capacitor and first feedback diode.

9. The limiter circuit according to claim 7 wherein the second biasing means for the second diode comprises:

a third resistor coupled to said power supply;

a fourth diode coupled to the third resistor; and a fourth resistor coupling the fourth diode to ground, the junction between the third resistor and fourth diode being coupled to the junction of the second capacitor and second feedback diode.

10. A limiter circuit, comprising:

an operational amplifier including a power input terminal for connection to a power supply, a non-inverting input for coupling to a D.C. signal, an inverting input for receiving an input signal to the limiter and an output terminal providing an output of the limiter;

a first feedback circuit including a first diode having a first voltage-temperature characteristic and a first capacitor;

a second feedback circuit including a second diode having a second voltage-temperature characteristic and a second capacitor;

a power supply;

first biasing means for biasing the first diode comprising a first resistor coupled to the power supply, a third diode having a third voltage-temperature characteristic for compensating the first voltage-temperature characteristic coupled to the first resistor and a second resistor coupling the third diode to ground, the junction between the third diode and second resistor being coupled to the junction of the first capacitor and first feedback diode; and second biasing means for biasing the second diode comprising a third resistor coupled to the power supply, a fourth diode having a fourth voltage-temperature characteristic for compensating the second voltage-temperature characteristic coupled to the third resistor and a fourth resistor coupling the fourth diode to ground, the junction between the third resistor and diode being coupled to the junction of the second capacitor and second feedback diode.

* * * * *

UNITED STATES PATENT AND TRADEMARK OFFICE
CERTIFICATE OF CORRECTION

PATENT NO. : 4,401,905

DATED : August 30, 1983

INVENTOR(S) : Ronald R. Conger

It is certified that error appears in the above-identified patent and that said Letters Patent is hereby corrected as shown below:

Col. 1, line 18, after "is" insert -- within --

Signed and Sealed this

Fifteenth Day of May 1984

[SEAL]

Attest:

Attesting Officer

GERALD J. MOSSINGHOFF

Commissioner of Patents and Trademarks